(12) United States Patent
Hu et al.

(10) Patent No.: US 11,320,452 B2
(45) Date of Patent: May 3, 2022

(54) MEMS ACCELEROMETER SELF-TEST USING AN ACTIVE MOBILE MASS DEFLECTION TECHNIQUE

(71) Applicants: STMicroelectronics, Inc., Coppell, TX (US); STMicroelectronics S.r.l., Agrate Brianza (IT)

(72) Inventors: Yamu Hu, Allen, TX (US); David McClure, Carrollton, TX (US); Alessandro Tocchio, Milan (IT); Naren K. Sahoo, Frisco, TX (US); Anthony Junior Casillan, Lewisville, TX (US)

(73) Assignees: STMicroelectronics, Inc., Coppell, TX (US); STMicroelectronics S.r.l., Agrate Brianza (IT)

( * ) Notice: Subject to any disclaimer, the term of this patent is extended or adjusted under 35 U.S.C. 154(b) by 323 days.

(21) Appl. No.: 16/452,904

(22) Filed: Jun. 26, 2019

(65) Prior Publication Data
US 2020/0408805 A1    Dec. 31, 2020

(51) Int. Cl.
*G01P 21/00* (2006.01)
*G01P 15/08* (2006.01)

(52) U.S. Cl.
CPC .......... *G01P 21/00* (2013.01); *G01P 15/0802* (2013.01); *G01P 2015/0868* (2013.01)

(58) Field of Classification Search
CPC ............... G01P 21/00; G01P 15/0802; G01P 2015/0868; B81B 2201/0235
See application file for complete search history.

(56) References Cited

U.S. PATENT DOCUMENTS

| | | |
|---|---|---|
| 5,351,519 A | 10/1994 | Kress |
| 6,029,516 A | 2/2000 | Mori et al. |
| 6,427,518 B1 | 8/2002 | Miekley et al. |
| 6,564,637 B1 | 5/2003 | Schalk et al. |
| 7,155,979 B2 | 1/2007 | Lasalandra et al. |

(Continued)

OTHER PUBLICATIONS

Ganesh K. Balachandran et al.: "A 3-Axis Gyroscope for Electronic Stability Control With Continuous Self-Test," IEEE Journal of Solid State Circuits, 2016, pp. 1-10.

(Continued)

*Primary Examiner* — Eric S. McCall
*Assistant Examiner* — Timothy P Graves
(74) *Attorney, Agent, or Firm* — Crowe & Dunlevy (57) ABSTRACT

A microelectromechanical system (MEMS) accelerometer sensor has a mobile mass and a sensing capacitor. To self-test the sensor, a test signal is applied to the sensing capacitor during a reset phase of a sensing circuit coupled to the sensing capacitor. The test signal is configured to cause an electrostatic force which produces a physical displacement of the mobile mass corresponding to a desired acceleration value. Then, during a read phase of the sensing circuit, a variation in capacitance of sensing capacitor due to the physical displacement of the mobile mass is sensed. This sensed variation in capacitance is converted to a sensed acceleration value. A comparison of the sensed acceleration value to the desired acceleration value provides an indication of an error in operation of the MEMS accelerometer sensor if the sensed acceleration value and desired acceleration value are not substantially equal.

51 Claims, 7 Drawing Sheets

(56) References Cited

U.S. PATENT DOCUMENTS

| | | | |
|---|---|---|---|
| 8,476,970 B2 | 7/2013 | Mokhtar et al. | |
| 9,714,842 B2 | 7/2017 | Anac et al. | |
| 9,846,037 B2 | 12/2017 | Aaltonen | |
| 10,760,910 B2 | 9/2020 | Gando et al. | |
| 2005/0016273 A1* | 1/2005 | Murata | G01P 15/125 |
| | | | 73/514.32 |
| 2005/0264366 A1 | 12/2005 | Zivanovic et al. | |
| 2005/0268716 A1 | 12/2005 | Krovat et al. | |
| 2006/0280202 A1 | 12/2006 | Kelly | |
| 2007/0084270 A1 | 4/2007 | Jarrett | |
| 2007/0169551 A1 | 7/2007 | Kelly | |
| 2008/0190199 A1 | 8/2008 | Prandi et al. | |
| 2010/0307243 A1 | 12/2010 | Prandi et al. | |
| 2011/0146402 A1 | 6/2011 | Donadel et al. | |
| 2011/0146403 A1 | 6/2011 | Rizzo Piazza Roncoroni et al. | |
| 2011/0197674 A1 | 8/2011 | Prandi et al. | |
| 2011/0254599 A1 | 10/2011 | Dikshit et al. | |
| 2012/0312095 A1 | 12/2012 | Hanson et al. | |
| 2013/0268227 A1 | 10/2013 | Opris et al. | |
| 2013/0271228 A1 | 10/2013 | Tao et al. | |
| 2013/0283908 A1 | 10/2013 | Geen et al. | |
| 2014/0190258 A1 | 7/2014 | Donadel et al. | |
| 2014/0250970 A1 | 9/2014 | Fang et al. | |
| 2014/0250971 A1 | 9/2014 | Fang et al. | |
| 2015/0033821 A1 | 2/2015 | Mangano | |
| 2015/0177775 A1 | 6/2015 | Beaulation et al. | |
| 2015/0185011 A1 | 7/2015 | Beaulaton et al. | |
| 2015/0226556 A1 | 8/2015 | Aaltonen | |
| 2015/0280949 A1 | 10/2015 | Cornibert et al. | |
| 2016/0010994 A1 | 1/2016 | Ackerman | |
| 2016/0103174 A1* | 4/2016 | Aaltonen | G01R 31/2884 |
| | | | 324/750.3 |
| 2016/0349056 A1 | 12/2016 | Thompson et al. | |
| 2017/0168088 A1 | 6/2017 | Coronato et al. | |
| 2017/0227569 A1 | 8/2017 | Alwardi et al. | |
| 2017/0328712 A1 | 11/2017 | Collin et al. | |
| 2018/0038692 A1 | 2/2018 | Prati et al. | |
| 2018/0335446 A1 | 11/2018 | Choi et al. | |
| 2019/0025056 A1 | 1/2019 | Hughes et al. | |
| 2019/0145773 A1 | 5/2019 | Collin et al. | |
| 2020/0278205 A1 | 9/2020 | Kraver | |
| 2020/0400433 A1 | 12/2020 | Aaltonen et al. | |
| 2020/0408523 A1 | 12/2020 | Fang et al. | |
| 2020/0408524 A1 | 12/2020 | Hu et al. | |

OTHER PUBLICATIONS

Maeda, Daisuke, et al: MEMS Gyroscope With Less Than 1-deg/h Bias Instability Variation in Temperature Range From −40° C. to 125° C., IEEE Sensors Journal, vol. 18, No. 3, Feb. 1, 2018, pp. 1006-1015.

Shaeffer, Derek K.: "MEMS Inertial Sensors: A Tutorial Overview," IEEE Communications Magazine, Apr. 2013, pp. 100-109.

Sun, X, et al: "Stability and Resolution Analysis of a Phase-Locked Loop Natural Frequency Tracking System for MEMS Fatigue Testing," Journal of Dynamic Systems, Measurement, and Control, Dec. 2002, vol. 124, pp. 599-605.

Bu, Feng, et al: "MEMS Gyroscope Automatic Real-Time Mode-Matching Method Based on Phase-Shifted 45o Additional Force Demodulation," MDPI, Sep. 7, 2018, 16 pages, 2018.

Zhazaaleh, Shadi, et al: "Vulnerability of MEMS Gyroscopes to Targeted Acoustic Attacks," IEEE Access, Jul. 5, 2019, 10 pages, 2019.

* cited by examiner

મેMS ACCELEROMETER SELF-TEST USING AN ACTIVE MOBILE MASS DEFLECTION TECHNIQUE

TECHNICAL FIELD

The present invention generally relates to a microelectromechanical system (MEMS) sensor of an accelerometer type and, in particular, to a technique for performing a self-test on the MEMS accelerometer.

BACKGROUND

A capacitive microelectromechanical system (MEMS) accelerometer sensor typically includes two stator nodes and one rotor node. An application specific integrated circuit (ASIC) is electrically connected to the three nodes of the MEMS sensor. The acceleration of the MEMS sensor in response to application of an external force causes a displacement of a mobile (proof) mass (which is electrically coupled to the one rotor node) relative to a pair of stationary electrodes (which are electrically coupled, respectively, to the two stator nodes) resulting in a change in capacitance. The ASIC applies a sensing voltage to the rotor node and monitors this change in capacitance at the two stator nodes to determine an acceleration due to the applied external force.

It is known to utilize a MEMS accelerometer sensor in a safety critical application such as with the passenger safety system of an automobile. For example, the MEMS accelerometer sensor may operate to assist with electronic stability control functions, mechanical fault detection and crash detection (for trigging airbag deployment and/or seat belt tensioning). It is accordingly imperative that the MEMS accelerometer sensor function properly. Self-testing of the MEMS accelerometer sensor, for example, at the time of vehicle start-up, is needed to ensure proper sensor operation.

There is a need in the art for a self-test technique for use in connection with a MEMS accelerometer sensor.

SUMMARY

In an embodiment, a method is presented for self-testing a microelectromechanical system (MEMS) accelerometer sensor having a mobile mass and first and second capacitors electrically connected to a first stator node and a second stator node, respectively. The method comprises: during a reset phase of a sensing circuit coupled to the first and second stator nodes, applying a first test signal to the first stator node and a second test signal to the second stator node, said first and second test signals configured to generate an electrostatic force which produces a physical displacement of the mobile mass corresponding to a desired acceleration value; during a read phase of the sensing circuit, sensing a difference in capacitance of the first and second capacitors due to the physical displacement of the mobile mass and converting the sensed difference to a sensed acceleration value; comparing the sensed acceleration value to the desired acceleration value; and indicating an error in operation of the MEMS accelerometer sensor if the sensed acceleration value and desired acceleration value are not substantially equal.

In an embodiment, a method is presented for self-testing a microelectromechanical system (MEMS) accelerometer sensor having a mobile mass and at least one sensing capacitor. The method comprises: during a reset phase of a sensing circuit coupled to the at least one sensing capacitor, applying a test signal to the at least one sensing capacitor, said test signal configured to generate an electrostatic force which produces a physical displacement of the mobile mass corresponding to a desired acceleration value; during a read phase of the sensing circuit, sensing a variation in capacitance of the at least one sensing capacitor due to the physical displacement of the mobile mass and converting the sensed variation in capacitance to a sensed acceleration value; comparing the sensed acceleration value to the desired acceleration value; and indicating an error in operation of the MEMS accelerometer sensor if the sensed acceleration value and desired acceleration value are not substantially equal.

BRIEF DESCRIPTION OF THE DRAWINGS

For a better understanding of the embodiments, reference will now be made by way of example only to the accompanying figures in which.

DETAILED DESCRIPTION

Figure 1:
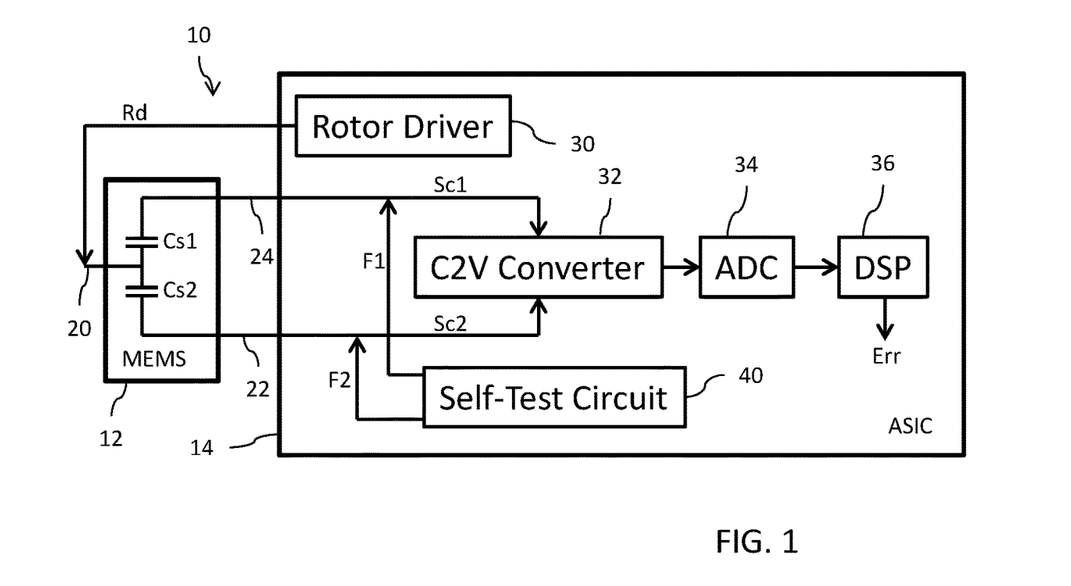
FIG. 1 is a block diagram of a microelectromechanical system (MEMS) accelerometer sensing system.

Reference is now made to FIG. 1 which shows a block diagram of a microelectromechanical system (MEMS) accelerometer sensing system 10. The system 10 includes a MEMS accelerometer sensor 12 and an application specific integrated circuit (ASIC) 14 that is electrically connected to the sensor 12. The MEMS accelerometer sensor 12 includes a rotor node 20 that is driven with a rotor drive signal Rd generated by ASIC 14 and two stator nodes 22 and 24 at which capacitive sense signals Sc1, Sc2 are output for processing by the ASIC. The rotor drive signal Rd is typically an AC signal that is generated by a driver circuit 30 of the ASIC 14 and has a certain drive frequency. The ASIC 14 includes a charge-to-voltage (C2V) converter circuit 32 coupled to receive the capacitive sense signals Sc1, Sc2 from the stator nodes 22 and 24 and which operates to convert a sensed change (i.e., difference) in capacitance of the MEMS accelerometer sensor 12 to an analog voltage. An analog-to-digital converter (ADC) circuit 34 functions to convert the analog voltage to a digital signal that is indicative of sensed acceleration for processing by a digital signal processor (DSP) 36 within the ASIC 14. In an embodiment, the ADC circuit 34 may comprise a sigma-delta ADC or a successive approximation (SAR) ADC or other suitable ADC known to those skilled in the art.

The general structural configuration of the MEMS accelerometer sensor 12 is well known to those skilled in the art. Generally speaking, the MEMS accelerometer sensor 12 includes a stator and a mobile (proof) mass. The stator and mobile mass may be made of semiconductor material connected by means of elastic (spring) suspension elements. The stator and mobile mass typically include a plurality of fixed arms and mobile arms, respectively, which are inter-digitated in a comb-fingered configuration so as to form a pair of capacitors which have a common electrical terminal coupled to the rotor node 20 and separate electrical terminals coupled, respectively, to the two stator nodes 22 and 24. The capacitance of each capacitor of the pair of capacitors depends on the relative positions of the arms which is, of course, dependent on the position of the mobile mass relative to the stator. In response to the applied force, there is movement of the mobile mass relative to the stator resulting in a corresponding change in capacitance. This change in capacitance is sensed by the ASIC through the capacitive sense signals Sc1, Sc2 and converted to a digital value indicative of acceleration. The MEMS accelerometer sensor 12 can be electrically represented as shown in FIG. 1 by a first sensing capacitor Cs1 having a first terminal electrically connected to the rotor node 20 and a second terminal electrically connected to the stator node 22 and configured to produce capacitive sense signal Sc1 in response to the rotor drive signal Rd and a second sensing capacitor Cs2 having a first terminal electrically connected to the rotor node 20 and a second terminal electrically connected to the stator node 24 and configured to produce capacitive sense signal Sc1 in response to the rotor drive signal Rd.

The C2V converter circuit 32 and ADC circuit 34 of the ASIC are controlled to cyclically operate in a reset phase and a read phase during which the rotor node 20 of the MEMS accelerometer sensor 12 is driven with the AC rotor drive signal Rd. In the reset phase, the sensing circuitry of the C2V converter circuit 32 is reset. For example, in the context of a C2V converter circuit 32 which implements a switched capacitor integration circuit, the integration capacitors are reset. The inputs of the C2V converter circuit 32 may be disconnected by a switching circuit from the stator nodes 22 and 24 during the reset phase. In the read phase, the sensing circuitry of the C2V converter circuit 32 is coupled to the stator nodes 22 and 24 and senses from the sense signals Sc1 and Sc2 the change in capacitance at the first and second sensing capacitors Cs1 and Cs2 which is indicative of an acceleration of the mobile mass within the MEMS accelerometer sensor 12. The analog voltage output by the C2V converter circuit 32 is converted to a digital signal by the ADC circuit 34, wherein the digital signal is indicative of the sensed acceleration.

Figure 2:
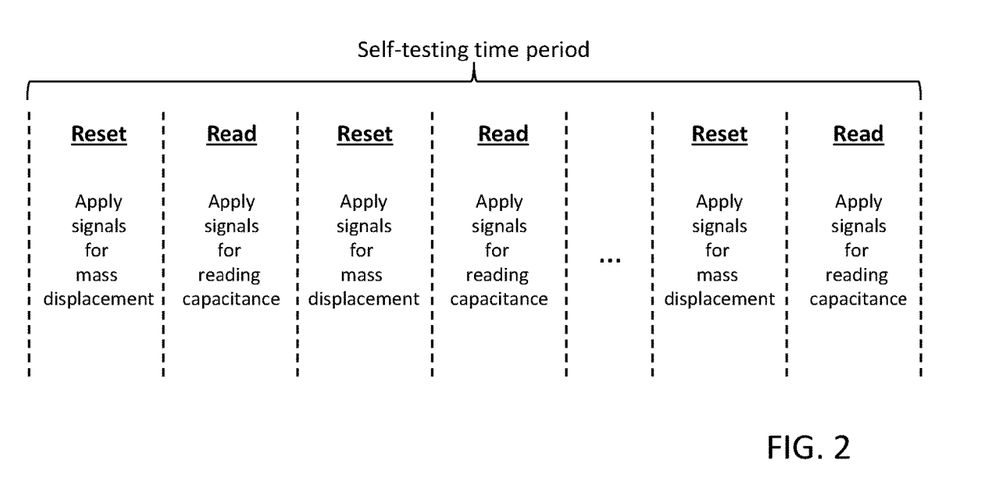
FIG. 2 illustrates components of a self-testing time period.

As previously noted, it is important to ensure that the MEMS accelerometer sensor 12 is functioning properly, and to that end the ASIC implements a self-test mode of operation. With reference to FIG. 2, the self-test mode of operation provides a self-testing time period which includes a plurality of repeats of the reset and read phases. A self-test circuit 40 operates during the reset phase to apply test signals F1 and F2 to the stator nodes 22 and 24, respectively, while the driver circuit applies the rotor drive signal Rd to the rotor node 20 and the sensing circuitry of the C2V converter circuit 32 is decoupled from the stator nodes 22 and 24. The application of the test signals F1 and F2 to the stator nodes 22 and 24 and rotor drive signal Rd to the rotor node 20 during each reset phase forces a physical displacement (i.e., a deflection) of the mobile mass of the MEMS accelerometer sensor 12. In this context, the test signals may comprise a voltage excursion or step applied to the stator. This forced physical displacement arises due to an electrostatic force applied through the interdigitation of the fixed arms and mobile arms for the first and second sensing capacitors Cs1 and Cs2 of the MEMS accelerometer sensor 12 in response to the applied test signals F1 and F2 and rotor drive signal Rd. The forced physical displacement is in addition to any displacement experienced by the mobile mass at that time due to an acceleration (for example, the influence of gravity). Application of the test signals is terminated before entering the subsequent read phase. In the read phase, the rotor drive signal Rd is applied to the rotor node 20 by the driver circuit and the sensing circuitry of the C2V converter circuit 32 is coupled to the stator nodes 22 and 24 to sense the change in capacitance at the first and second sensing capacitors Cs1 and Cs2 due to the forced physical displacement of the mobile mass.

The magnitudes and durations of the applied test signals during reset phases of the self-testing time period are selected to produce a certain degree of physical displacement (magnitude and direction) of the mobile mass relative to the stator that corresponds to a desired acceleration value. The sensed changes in capacitance at the first and second sensing capacitors Cs1 and Cs2 as a result of the application of the test signals F1 and F2 produce an analog voltage output by the C2V converter circuit 32 that is converted to a digital signal by the ADC circuit 34. The digital signals can be processed to produce an output which is indicative of a sensed acceleration corresponding to the forced physical displacement during the self-testing time period. Either the DSP within the ASIC 14 or a separate processing circuit coupled to the ASIC then processes the sensed acceleration value due to the forced physical displacement in response to the applied test signals in comparison to the desired acceleration value. If a comparison difference between the sensed and desired acceleration values exceeds a threshold, this is indicative of an erroneous operation of the MEMS accelerometer sensor 12. An error signal Err is then generated in response to the detected erroneous operation. The error signal may be output at the end of the self-testing time period, or alternatively, at the completion of plural self-testing time periods, if a determination is made that the sensed and desired acceleration values are not substantially equal.

Figure 3A:
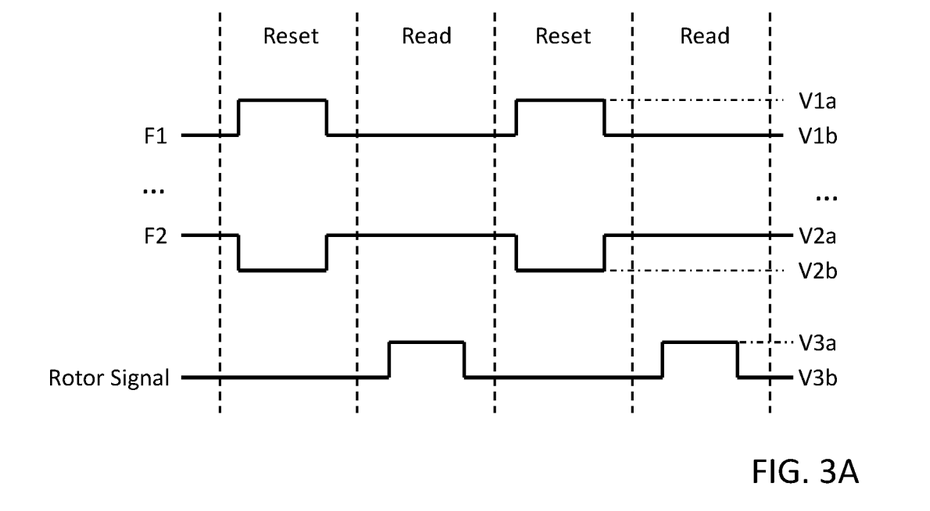
FIGS. 3A and 3B show application of signals to the nodes of the MEMS sensor for producing a physical displacement (magnitude and direction) of the mobile mass by an electrostatic force.

Consider now a specific example of the applied test signals F1 and F2 and rotor drive signal Rd as shown by FIG. 3A during an implementation of the self-test mode of operation. The illustration of FIG. 3A shows just two consecutive cycles of the reset and read phases, it being understood that the self-testing time period includes many more cycles (see, FIG. 2). To produce a physical displacement (magnitude and direction) of the mobile mass by an electrostatic force that corresponds to a desired positive acceleration value of, for example, 1 g, the self-test circuit 40 causes, during each reset phase: the application of test signal F1 as a positive pulse signal having a maximum magnitude at a V1$a$ voltage level and a minimum magnitude at a V1$b$ voltage level; and the application of test signal F2 as a negative pulse signal having a maximum magnitude at a V2$a$ voltage level and a minimum magnitude at a V2$b$ voltage level. The test signals F1 and F2 are applied 180° out of phase from each other. As an example, V1a>V2a, V1b=V2a, and V2b>ground. Furthermore, during each reset phase, the rotor drive signal Rd is driven by rotor driver circuit 30 to a minimum magnitude at a V3b voltage level in order to ensure maximum deflection of the mobile mass. During each read phase, the pulses of the test signals F1 and F2 are not applied by the self-test circuit 40, but the rotor drive signal Rd applied by the rotor driver circuit 30 is a positive pulse having a maximum magnitude at a V3a voltage level and a minimum magnitude at the V3b voltage level. As an example, V3a is typically equal to both V2a and V1b, and V3b may be equal to ground.

With this self-test configuration, the digital signals output by the ADC circuit 34 should be indicative of a sensed acceleration that is substantially equal to the desired positive acceleration value (i.e., positive 1 g). In this context, substantially equal means within a certain threshold difference (that could, for example, be measured in terms of a percentage offset that is less than ±2-3% or measured in terms of an absolute threshold value of, for example, 0.05 g, for the difference between the sensed and desired acceleration values). If the sensed acceleration does not substantially equal the desired acceleration value, then the error signal Err is asserted.

Figure 3B:
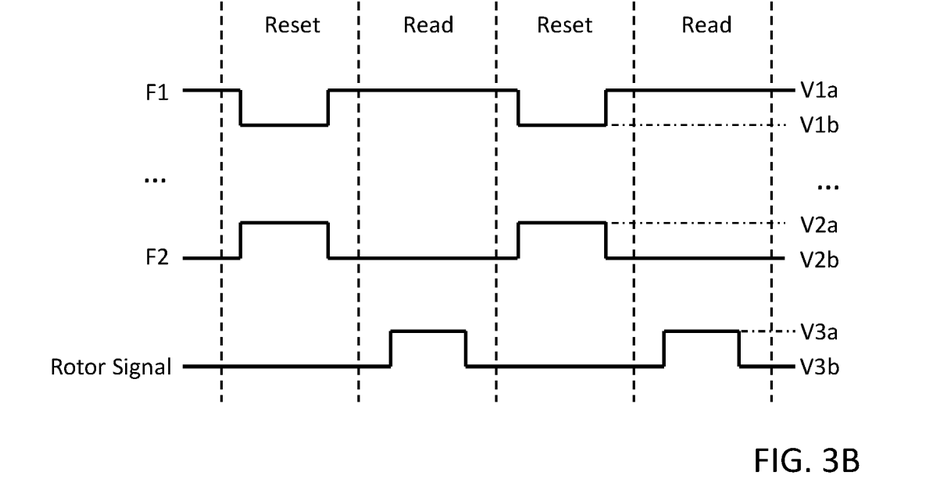

Now consider a specific example of the applied test signals F1 and F2 and rotor drive signal Rd as shown by FIG. 3B during an implementation of the self-test mode of operation. The illustration of FIG. 3B shows just two consecutive cycles of the reset and read phases, it being understood that the self-testing time period includes many more cycles (see, FIG. 2). To produce a physical displacement (magnitude and direction) of the mobile mass by an electrostatic force that corresponds to a desired negative acceleration value (opposite that of the FIG. 3A example), the self-test circuit 40 causes, during each reset phase: the application of test signal F1 as a negative pulse signal having a maximum magnitude at the V1a voltage level and a minimum magnitude at the V1b voltage level; and the application of test signal F2 as a positive pulse signal having a maximum magnitude at the V2a voltage level and a minimum magnitude at the V2b voltage level. The test signals F1 and F2 are applied 180° out of phase from each other. Furthermore, during each reset phase, the rotor drive signal Rd is driven by rotor driver circuit 30 to a minimum magnitude at the V3b voltage level in order to ensure maximum deflection of the mobile mass. During each read phase, the pulses of the test signals F1 and F2 are not applied by the self-test circuit 40, but the rotor drive signal Rd applied by the rotor driver circuit 30 is a positive pulse having a maximum magnitude at the V3a voltage level and a minimum magnitude at the V3b voltage level.

With this self-test configuration, the digital signals output by the ADC circuit 34 should be indicative of a sensed acceleration that is substantially equal to the desired negative acceleration value (i.e., negative 1 g). In this context, substantially equal means within a certain threshold difference (that could, for example, be measured in terms of a percentage offset that is less than ±2-3% or measured in terms of an absolute threshold value of, for example, 0.05 g, for the difference between the sensed and desired acceleration values). If the sensed acceleration does not substantially equal the desired acceleration value, then the error signal Err is asserted.

Figure 3C:
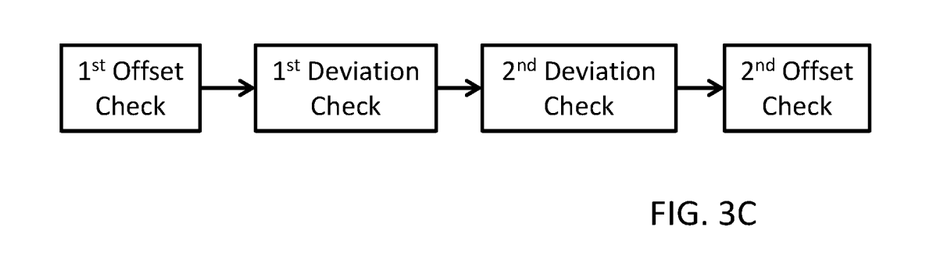
FIG. 3C shows an example of a testing procedure.

A preferred implementation of the self-test mode of operation would perform both the positive (for example, +1 g) physical displacement of the mobile mass and the negative (for example, −1 g) physical displacement of the mobile mass. The reason for this is to ensure proper operation of the MEMS accelerometer sensor 12 for both acceleration directions. These tests are performed sequentially in either order and in combination with testing in the absence of induced displacement. As an example of this, the following test procedure may be implemented as shown by FIG. 3C. A first offset check is performed. In this first offset check, no physical displacement (magnitude and direction) of the mobile mass is induced by electrostatic force through the signals F1/F2. For a level orientation of the sensor, the expected output would be to sense 0 g. It is recognized, however, that a level orientation cannot be assured in all cases where the test procedure is implemented, and in such a case the output will produce a value indicative of the non-level output (for example, a value between −1 g and +1 g depending on orientation angle). Next, a first deflection check is performed. This first deflection check induces a physical displacement (magnitude and direction) of the mobile mass by electrostatic force through the signals F1/F2. For example, this first deflection check can be implemented as described above in connection with FIGS. 3A and 3B. For a multi-axis sensor the deflection can be positive 1 g on the X/Z channels and negative 1 g on the Y channel. If there is not a level orientation of the sensor, the response will not be +1 g/−1 g. So, to compensate for this, the error check should determine whether a difference between the first deflection check and the first offset check is within a target value±a threshold. The target value in this case is +1 g for the X/Z channel and −1 g for the Y channel. Next, a second deflection check is performed. This second deflection check also induces a physical displacement (magnitude and direction) of the mobile mass by electrostatic force through the signals F1/F2, but is in the opposite direction from the first deflection check. For example, this second deflection check can be implemented as described above in connection with FIGS. 3A and 3B. For a multi-axis sensor the deflection can be negative 1 g on the X/Z channels and positive 1 g on the Y channel. The error check should determine whether a difference between the second deflection check and the first deflection check is within a target value±a threshold. The target value in this case is +2 g for the Y channel and −2 g for the X/Z channel. A last part of the test procedure performs a second offset check. Similar to the first offset check, in the second offset check there is no induced physical displacement (magnitude and direction) of the mobile mass by electrostatic force through the signals F1/F2. The output should be the same as with the first offset check. The error signal Err is generated in response to performance of the FIG. 3C test procedure, with the error signal Err being asserted if any one or more of the checks fail.

Figure 4A:
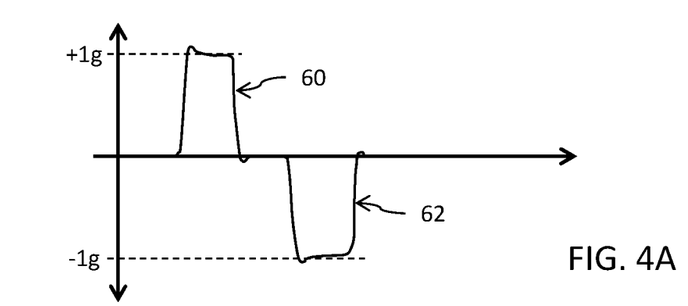
FIGS. 4A-4D illustrate examples of sensed acceleration in response to the forced physical displacement of the mobile mass.

FIG. 4A is a graph showing the sensed acceleration in response to the applied test signals F1 and F2 set to produce a physical displacement (magnitude and direction) of the mobile mass by electrostatic force that corresponds to a desired acceleration value of positive 1 g (as with FIG. 2) and negative 1 g (as with FIG. 3). It will be noted that the sensed positive deflection 60 has a magnitude that is substantially equal to positive 1 g and the sensed negative deflection 62 has a magnitude that is substantially equal to negative 1 g. In this case, the self-test of the MEMS accelerometer sensor 12 is passed.

Figure 4B:
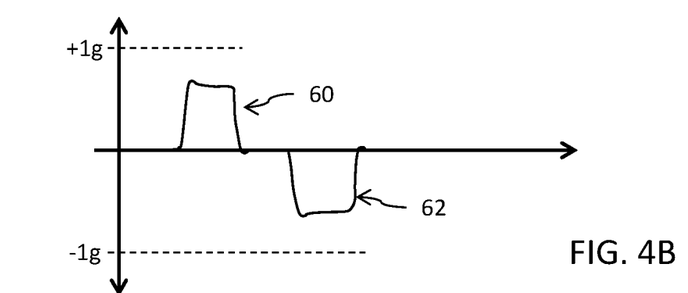

FIG. 4B is a graph showing the sensed acceleration in response to the applied test signals F1 and F2 set to produce a physical displacement (magnitude and direction) of the mobile mass by electrostatic force that corresponds to a desired acceleration value of positive 1 g (as with FIG. 2) and negative 1 g (as with FIG. 3). It will be noted that the sensed positive deflection 60 has a magnitude that does not substantially equal positive 1 g (it is much less) and the sensed negative deflection 62 has a magnitude that does not substantially equal negative 1 g (it is much less). In this case, the self-test of the MEMS accelerometer sensor 12 fails and the error signal Err will be asserted.

Figure 4C:
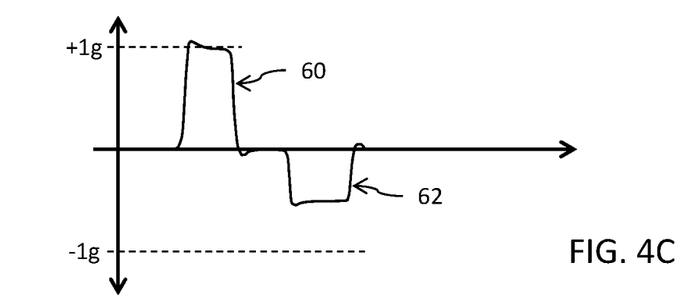

FIG. 4C is a graph showing the sensed acceleration in response to the applied test signals F1 and F2 set to produce a physical displacement (magnitude and direction) of the mobile mass by electrostatic force that corresponds to a desired acceleration value of positive 1 g (as with FIG. 2) and negative 1 g (as with FIG. 3). It will be noted that the sensed positive deflection 60 has a magnitude that is substantially equal to positive 1 g, but the sensed negative deflection 62 has a magnitude that does not substantially equal negative 1 g (it is much less). In this case, the self-test of the MEMS accelerometer sensor 12 fails and the error signal Err will be asserted.

Figure 4D:
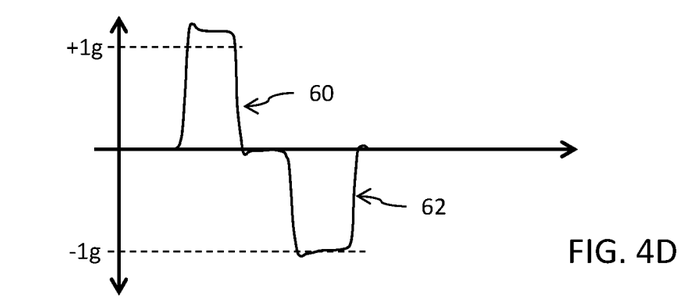

FIG. 4D is a graph showing the sensed acceleration in response to the applied test signals F1 and F2 set to produce a physical displacement (magnitude and direction) of the mobile mass by electrostatic force that corresponds to a desired acceleration value of positive 1 g (as with FIG. 2) and negative 1 g (as with FIG. 3). It will be noted that the sensed positive deflection 60 has a magnitude that does not substantially equal positive 1 g (it is much greater) and the sensed negative deflection 62 has a magnitude that is substantially equal to negative 1 g. In this case, the self-test of the MEMS accelerometer sensor 12 fails and the error signal Err will be asserted.

Figure 5:
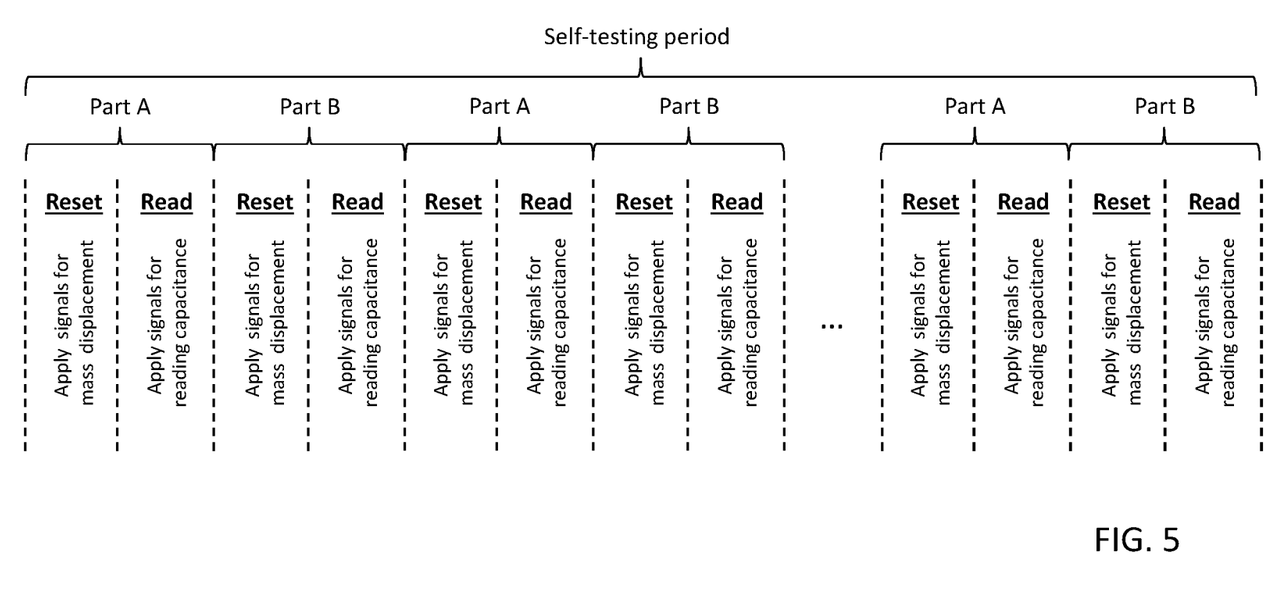
FIG. 5 illustrates components of the self-testing time period configured to include interleaved testing parts.

Consider now a specific example of the self-test mode of operation as shown by FIG. 5. With reference to FIG. 5, an alternative implementation of the self-test mode of operation provides a self-testing time period which includes a plurality of repeats of the reset and read phases.

The self-test operation includes two parts A and B, wherein part A includes a plurality of reset phases and read phases, and part B includes a plurality of reset phases and read phases. In particular, the pairs of reset and read phases for the part A and the pairs of reset and read phases for the part B are interleaved with each other (see, FIG. 6C). The inclusion of two parts A and B in the self-test operation provides an advantage in that this integrates a "chopping" technique in the self-testing operational mode which can assist in removing leakage (offset) current from the stators to the ground (reference voltage). As an alternative, to chopping, it is possible to instead use an auto-zeroing technique for the purpose of removing leakage (offset) current from the stators to the ground (reference voltage).

Figure 6A:
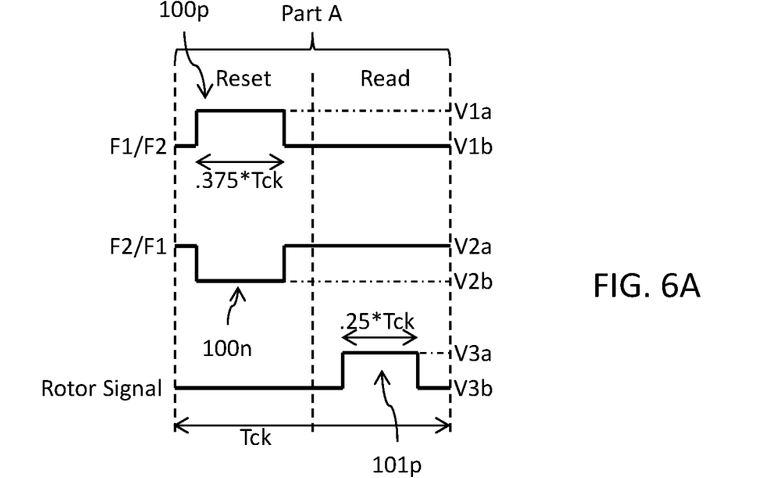
FIG. 6A illustrates waveforms for the testing signals during one part of the self-testing time period of FIG. 5.

Reference is now made to FIG. 6A which illustrates waveforms for the testing signals during each part A of the self-testing time period of FIG. 5. One of the test signals F1/F2 is defined by a negative pulse 100n and the other of the test signals F2/F1 is defined by a positive pulse 100p. The choice of which test signal F1 or F2 has the positive pulse 110p and which has the negative pulse 100n is determined by the desired direction of the forced physical displacement of the mobile mass (see, FIGS. 3A and 3B). The rotor drive signal Rd is defined by a positive pulse 101p. The pulses 100p, 100n and 101p are defined relative to a clock signal having a period Tck. The pulses 100p and 100n have a first duty cycle corresponding to the pulse width and have leading a trailing pulse edges that are aligned with each other. Again, as noted elsewhere herein, the pulses 100p and 100n are 180° out of phase with each other. The pulse 101p has a second duty cycle corresponding to the pulse width and which is offset from, and non-overlapping with, the pulses 100p and 100n. In a preferred implementation, the first duty cycle is greater than the second duty cycle, with example values for the first duty cycle and second duty cycle being 37.5% and 25%, respectively.

Figure 6B:
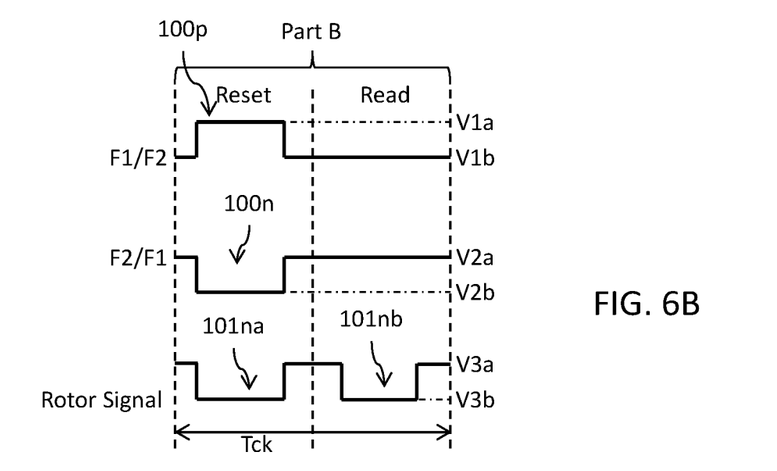
FIG. 6B illustrates waveforms for the testing signals during one part of the self-testing time period of FIG. 5.
Figure 6C:
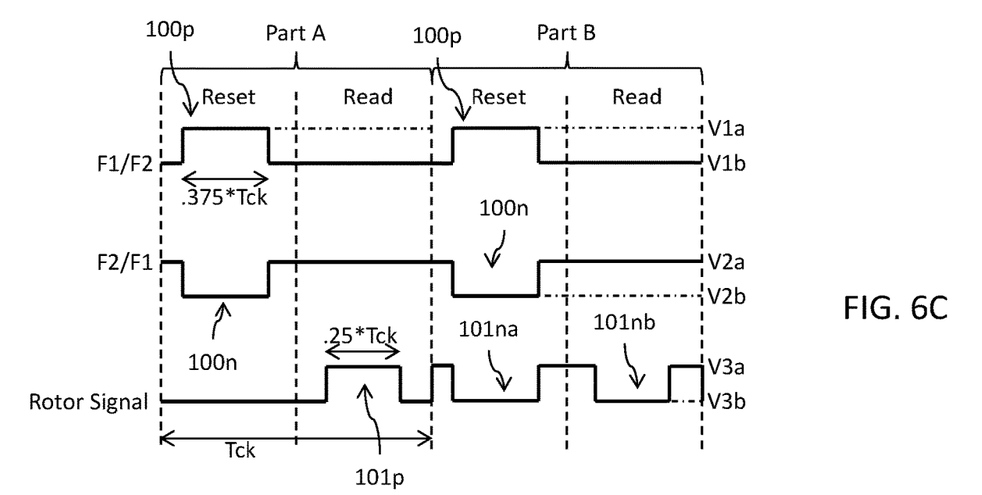
FIG. 6C illustrates alternation of the FIGS. 6A-6B waveforms during self-testing.

Reference is now made to FIG. 6B which illustrates waveforms for the testing signals during each part B of the self-testing time period of FIG. 5. One of the test signals F1/F2 is defined by a negative pulse 100n and the other of the test signals F2/F1 is defined by a positive pulse 100p. The choice of which test signal F1 or F2 has the positive pulse 110p and which has the negative pulse 100n is determined by the desired direction of the forced physical displacement of the mobile mass (see, FIGS. 3A and 3B). The rotor drive signal Rd is defined by a pair of negative positive pulses 101n. The pulses 100p, 100n and 101n are defined relative to a clock signal having a period Tck. The pulses 100p and 100n have the first duty cycle corresponding to the pulse width and have leading a trailing pulse edges that are aligned with each other. Again, as noted elsewhere herein, the pulses 100p and 100n are 180° out of phase with each other. The pair of pulses 101n include a first negative pulse 101na having the first duty cycle and which is aligned with the pulses 100p and 100n, and a second negative pulse having a second duty cycle corresponding to the pulse width and which is offset from, and non-overlapping with, the pulses 100p and 100n. The first negative pulse 101na is needed in order to put the rotor voltage at the V3b voltage level which is required in order to achieve the desired degree of mobile mass displacement in response to the applied pulses 100 of the test signals F1 and F2.

Figure 7A:
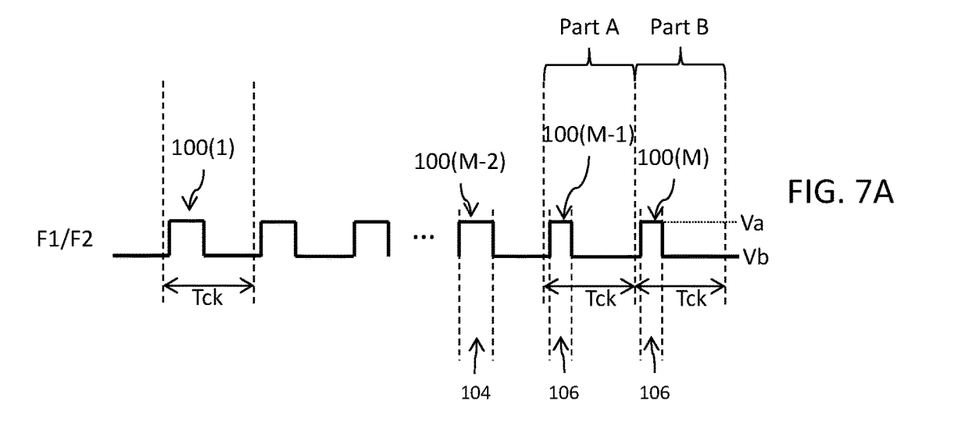
FIG. 7A illustrates a duty cycle adjustment for the series of pulses.

The duty cycle of the pulses 100 for the test signals F1 and F2 is controlled by the self-test circuit 40. It will be understood that the identification above of a first duty cycle equal to 37.5% is just an example of the duty cycle set by the self-test circuit 40. In addition, the duty cycle of the pulses 100 may vary within the duration of the self-testing time period. For example, if there are N pulses 100 within one self-testing time period, X of the pulses 100 may be controlled to have the first duty cycle and Y of the pulses may be controlled to have a third duty cycle (where M=X+Y). This is illustrated by FIG. 7A where the pulses 100(1) to 100(M-2) within the self-testing time period have the first duty cycle 104 and the last two pulses 100(M-1) and 100(M) have the third duty cycle 106. In this example, the third duty cycle is shorter than the first duty cycle. The illustration of just the pulses 100 of the last part A and part B pair within the self-testing time period having a shortened duty cycle is an example only, as the number Y of pulses 100 with the third duty cycle can be any number as needed. FIG. 7A illustrates the test signal F1/F2 with positive pulses 100p having a maximum voltage Va and minimum voltage Vb, but it will be understood that the implementation is equally applicable to the negative pulses 100n having a maximum voltage Va and minimum voltage Vb (wherein Va corresponds to voltages Va1 or Va2 and Vb corresponds to voltages Vb1 or Vb2).

Figure 7B:
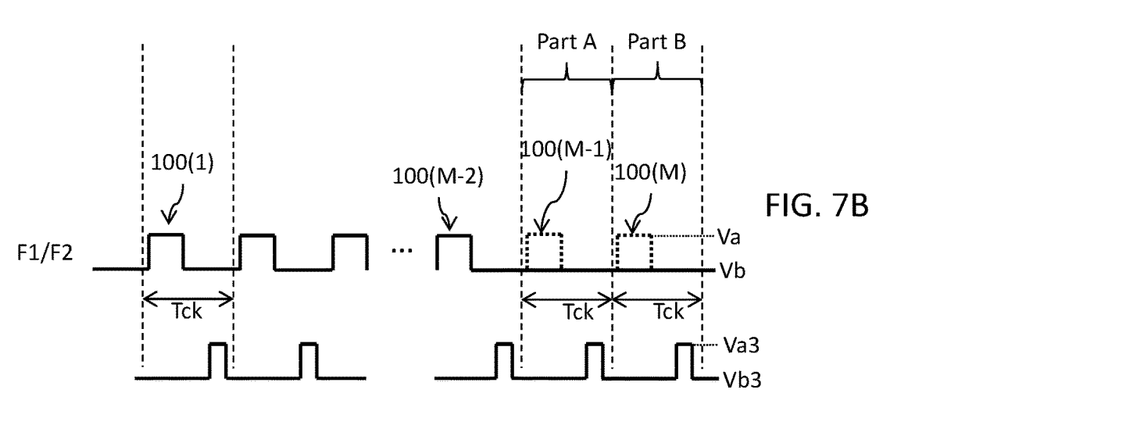
FIG. 7B illustrates a pulse skipping operation for the series of pulses.

Still further, the control exercised by the self-test circuit 40 may include implementation of a pulse skipping. For example, if there are M pulses 100 within one self-testing time period, R of the pulses 100 may be asserted and S of the pulses 100 may be skipped (where M=R+S). The skipped pulses may be placed by the self-test circuit 40 at any desired location within the series of pulses 102, but is preferably implemented at the end of the self-testing time period. This is illustrated by FIG. 7B where the pulses 100(1) to 100(M-2) within the self-testing time period are asserted and the pulses 100(M-1) and 100(M), illustrated in dotted lines, have been skipped. The illustration of just the pulses 100 of the last part A and part B pair within the self-testing time period being skipped is an example only, as the number S of pulses 100 skipped can be any number as needed. FIG. 7B illustrates the test signal F1/F2 with positive pulses 100p having a maximum voltage Va and minimum voltage Vb, but it will be understood that the implementation is equally applicable to the negative pulses 100n having a maximum voltage Va and minimum voltage Vb (wherein Va corresponds to voltages Va1 or Va2 and Vb corresponds to voltages Vb1 or Vb2). FIG. 7B further illustrates that the pulse 101 of the rotor drive signal Rd will be applied in any event during each period Tck within which the pulses 100 are skipped, with the pulse 101 having a maximum voltage Va3 and minimum voltage Vb3.

Figure 7C:
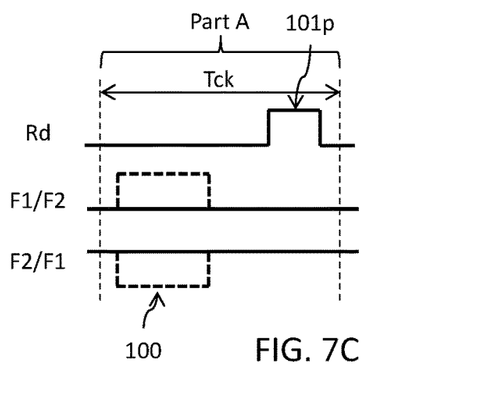
FIGS. 7C to 7D illustrate a timing relationship between an AC rotor drive signal and each pulse of a test signal in pulse skipping operation.
Figure 7D:
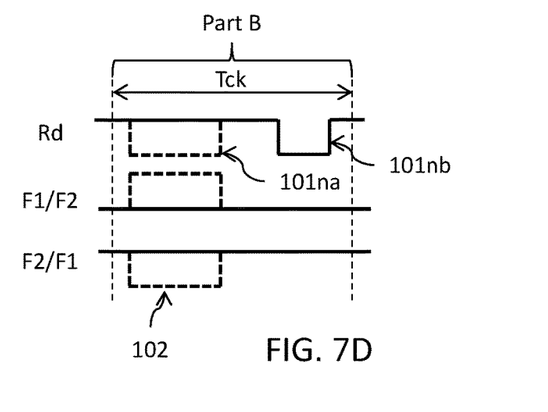

FIG. 7C illustrates in more detail the timing relationship between the pulses 101 of AC rotor drive signal Rd and a pulse skipping of a pulse 100 of the test signals F1 and F2 in the reset phase of part A of the self-test. FIG. 7D illustrates the timing relationship between the pulses 101 of the AC rotor drive signal Rd and a pulse skipping of a pulse 100 the test signals F1 and F2 in the reset phase of part B of the self-test. It will be noted that the skipping of the pulse 100 for the test signals F1 and F2 in part B of the self-test causes a corresponding skipping of the first negative pulse 101na.

As discussed above, the test signals F1 and F2 are applied to produce a physical displacement (magnitude and direction) of the mobile mass by electrostatic force that corresponds to a desired acceleration value (for example, positive 1 g and/or negative 1 g). Accuracy of the produced physical displacement is important. By controlling the number of pulses 102 within each pulse envelope 100 through the pulse skipping operation and by controlling the duty cycle of each pulse 102 of the series of pulses within each pulse envelope 100, the self-test circuit 40 can tune the physical displacement of the mobile mass to as to achieve the desired acceleration value. In this context, the magnitude of the physical displacement of the mobile mass is related to the average electrostatic force of the stimulus pulse applied to the stator nodes 22 and 24, which is a function of applied voltage difference across the capacitor multiplied by a total time duration of the stimulus pulse. So, the applied electrostatic force to displace the mobile mass is accordingly a function of a sum of the voltage difference times the pulse duration for the pulses 102 within the series of pulses contained within the pulse envelope 100. From this it is clear that if the electrostatic force needed to displace the mobile mass to a degree equal to the desired acceleration value is known, and if the voltage difference is known, then one can calculate the number of pulses and pulse widths needed. From this, the required pulse skipping and duty cycle needed can be calculated and implemented by the self-test circuit 40 in generating the test signals F1 and F2.

The calculation can be further fine-tuned based on a calibration process. For example, if the calculation indicates use of the first duty cycle for all pulses 102 within the series of pulses, but the produced physical displacement corresponds to +1.03 g, an adjustment may be made. So, if the desired acceleration value is +1 g, an adjustment of the duty cycle of one or more of the pulses 102 can be made to achieve a displacement corresponding to an accurate +1 g acceleration. Likewise, an adjustment to skip one or more of the pulses 102 within the series of pulses can be made to achieve the displacement corresponding to an accurate +1 g acceleration. A combination of duty cycle adjustment and pulse skipping may be needed to fine tune the displacement to meet the desired +1 g acceleration. Once the proper combination of number of pulses 102 duty cycle of each pulse 102 of the series of pulses within each pulse envelope 100 to achieve the accurate displacement for a +g acceleration, these parameters are stored by the self-test circuit 40 and used each time the self-testing operation is performed.

There is a difference in duty cycle and amplitude of the signals applied to the MEMS accelerometer sensor 12 in normal sensing mode and self-test mode. The impact from spring softening needs to be considered in order for the accuracy of the forced deflection to be ensured. Accordingly, the self-testing process described herein should be performed only after a calibration is performed on the MEMS accelerometer sensor 12. Once the sensor is calibrated, the self-test may be initiated where: a) the test signals F1 and F2 are applied to force a physical displacement of the mobile mass in a first direction corresponding to the desired acceleration value and the sensed acceleration value of the displaced mobile mass is determined and reported; and b) the test signals F1 and F2 are applied to force a physical displacement of the mobile mass in a second direction (opposite to the first direction) corresponding to the desired acceleration value and the sensed acceleration value of the displaced mobile mass is determined and reported. An optional step to perform a second calibration of on the MEMS accelerometer sensor 12 may then be performed. The sensed acceleration values from steps a) and b) are then each compared to the desired acceleration value as previously described for the purpose of detected operational error of the MEMS accelerometer sensor 12.

It is known in the art for MEMS accelerometer sensor 12 to be configured as a three-axis sensor. In such a case, the foregoing process is performed for at least one axis, and more preferably all three axes, of the MEMS accelerometer sensor 12. The error signal may be issued if the self-test fails for any one axis. Alternatively, separate error signals may be issued for each axis to indicate the presence of an error.

An advantage of the self-testing solution disclosed herein is that the testing process takes advantage of the existing rotor and stator nodes of the MEMS accelerometer sensor for application of the signals for forcing a physical displacement of the mobile mass. In other words, the disclosed solution does require the presence of testing nodes for the package of the MEMS accelerometer sensor. Another advantage of the self-testing solution disclosed herein is that the testing process is integrated with the existing electrical connections between the MEMS accelerometer sensor and the C2V converter circuit of the ASIC. Yet another advantage of the self-testing solution disclosed herein is that the testing process uses the same signal processing path (C2V converter, ADC, DSP) to perform the sensing and acceleration calculation for both the test mode and normal mode. A further advantage of the self-testing solution disclosed herein is that the control/trimming operations for the voltage/timing/sequence of the pulses of the test signals F1 and F2 is provided on the ASIC chip itself through the self-test circuit.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method for self-testing a microelectromechanical system (MEMS) accelerometer sensor having a mobile mass and first and second capacitors electrically connected to a first stator node and a second stator node, respectively, and a rotor node, comprising:
   during a reset phase of a sensing circuit coupled to the first and second stator nodes, applying a first test signal including a pulse to the first stator node and a second test signal including a pulse to the second stator node, said first and second test signals configured to generate an electrostatic force which produces a physical displacement of the mobile mass corresponding to a desired acceleration value;
   applying an AC drive signal to the rotor node, wherein the AC drive signal has a low voltage level during assertion of each pulse for the first and second test signals; and
   during a read phase of the sensing circuit, sensing a difference in capacitance of the first and second capacitors due to the physical displacement of the mobile mass and converting the sensed difference to a sensed acceleration value.

2. The method of claim 1, further comprising:
   comparing the sensed acceleration value to the desired acceleration value; and
   indicating an error in operation of the MEMS accelerometer sensor if the sensed acceleration value and desired acceleration value are not substantially equal.

3. The method of claim 1, wherein the pulses of the first and second test signals are 180° out of phase with each other.

4. The method of claim 1, wherein each pulse of the first test signal has a first high voltage level and a first low voltage level and wherein each pulse of the second test signal has a second high voltage level and a second low voltage level.

5. The method of claim 4, wherein the first high voltage level is greater than the second high voltage level and the first low voltage level is greater than the second low voltage level.

6. The method of claim 4, wherein the first low voltage level and the second high voltage level are substantially equal.

7. The method of claim 1, further comprising generating the first test signal as a plurality of pulses over a self-testing time period and generating the second test signal as a plurality of pulses over said self-testing time period.

8. The method of claim 7, further comprising generating the pulses of the first and second test signals to have a same duty cycle.

9. The method of claim 7, further comprising generating the pulses of the first and second test signals to have different duty cycles.

10. The method of claim 7, further comprising skipping at least one pulse of the first and second test signals within said self-testing time period.

11. The method of claim 7, further comprising selecting a number of pulses of the first and second test signals within said self-testing time period and a duty cycle of the pulses of the first and second test signals within said self-testing time period in order to set a magnitude of the physical displacement of the mobile mass.

12. The method of claim 1, further comprising:
   cyclically repeating the reset and read phases over a self-testing time period; and
   at an end of the self-testing time period:
      comparing the sensed acceleration value to the desired acceleration value; and
      indicating an error in operation of the MEMS accelerometer sensor if the sensed acceleration value and desired acceleration value are not substantially equal.

13. The method of claim 12, wherein the pulse of the first test signal during the reset phase comprises a first polarity pulse and wherein the pulse of the second test signal during the reset phase comprises a second polarity pulse that is temporally aligned with and opposite the first polarity pulse.

14. The method of claim 13, said rotor drive signal comprising a pulse having a polarity same as the first polarity pulse.

15. The method of claim 13, said rotor drive signal comprising a pulse having a polarity same as the second polarity pulse.

16. The method of claim 1, wherein the physical displacement of the mobile mass in response to said first and second test signals corresponds to the desired acceleration value which is a positive acceleration.

17. The method of claim 1, wherein the physical displacement of the mobile mass in response to said first and second test signals corresponds to the desired acceleration value which is a negative acceleration.

18. The method of claim 1, wherein the physical displacement of the mobile mass in response to said first and second test signals is performed in a first deflection check which corresponds to the desired acceleration value which is a positive acceleration and further performed in a second deflection check which corresponds to the desired acceleration value which is a negative acceleration.

19. The method of claim 18, wherein the first and second deflection checks are performed in either order.

20. A method for self-testing a microelectromechanical system (MEMS) accelerometer sensor having a mobile mass and at least one sensing capacitor and a rotor node, comprising:
   during a reset phase of a sensing circuit coupled to the at least one sensing capacitor, applying a test signal including a pulse to the at least one sensing capacitor, said test signal configured to generate an electrostatic force which produces a physical displacement of the mobile mass corresponding to a desired acceleration value;
   applying an AC drive signal to the rotor node, wherein the AC drive signal has a low voltage level during assertion of each pulse for the test signal; and
   during a read phase of the sensing circuit, sensing a variation in capacitance of the at least one sensing capacitor due to the physical displacement of the mobile mass and converting the sensed variation in capacitance to a sensed acceleration value.

21. The method of claim 20, further comprising:
   comparing the sensed acceleration value to the desired acceleration value; and
   indicating an error in operation of the MEMS accelerometer sensor if the sensed acceleration value and desired acceleration value are not substantially equal.

22. The method of claim 20, further comprising generating the test signal as a series of pulses over a self-testing time period including a plurality of reset phases.

23. The method of claim 22, further comprising generating pulses within the series of pulses over said self-testing time period to have a same duty cycle.

24. The method of claim 22, further comprising generating pulses within the series of pulses over said self-testing time period such that at least two pulses have different duty cycles.

25. The method of claim 22, further comprising skipping at least one pulse within the series of pulses over said self-testing time period.

26. The method of claim 22, further comprising selecting a number of pulses within the series of pulses over said self-testing time period and a duty cycle of the pulses within the series of pulses over said self-testing time period in order to set a magnitude of the physical displacement of the mobile mass.

27. The method of claim 20, further comprising:
cyclically repeating the reset and read phases over a self-testing time period; and
at an end of the self-testing time period:
comparing the sensed acceleration value to the desired acceleration value; and
indicating an error in operation of the MEMS accelerometer sensor if the sensed acceleration value and desired acceleration value are not substantially equal.

28. The method of claim 20, wherein the physical displacement of the mobile mass in response to said test signal corresponds to the desired acceleration value which is a positive acceleration.

29. The method of claim 20, wherein the physical displacement of the mobile mass in response to said test signal corresponds to the desired acceleration value which is a negative acceleration.

30. The method of claim 20, wherein the physical displacement of the mobile mass in response to said test signal is performed in a first deflection check which corresponds to the desired acceleration value which is a positive acceleration and further performed in a second deflection check which corresponds to the desired acceleration value which is a negative acceleration.

31. The method of claim 30, wherein the first and second deflection checks are performed in either order.

32. A method for self-testing a microelectromechanical system (MEMS) accelerometer sensor having a mobile mass and at least one sensing capacitor, comprising:
cyclically repeating a sensing circuit reset phase and a sensing circuit read phase over a self-testing time period;
generating a test signal that includes a series of pulses over said self-testing time period;
during each sensing circuit reset phase, applying a pulse of said test signal to the at least one sensing capacitor in order to generate an electrostatic force which produces a physical displacement of the mobile mass corresponding to a desired acceleration value;
selecting a number of pulses within the series of pulses and a duty cycle of the pulses within the series of pulses in order to set a magnitude of the physical displacement of the mobile mass; and
during each read phase of the sensing circuit, sensing a variation in capacitance of the at least one sensing capacitor due to the physical displacement of the mobile mass and converting the sensed variation in capacitance to a sensed acceleration value.

33. The method of claim 32, further comprising:
comparing the sensed acceleration value to the desired acceleration value; and
indicating an error in operation of the MEMS accelerometer sensor if the sensed acceleration value and desired acceleration value are not substantially equal.

34. The method of claim 32, wherein said pulses within the series of pulses have a same duty cycle.

35. The method of claim 32, wherein at least two pulses within the series of pulses have different duty cycles.

36. The method of claim 32, further comprising skipping at least one pulse within the series of pulses.

37. The method of claim 32, further comprising, at an end of the self-testing time period:
comparing the sensed acceleration value to the desired acceleration value; and
indicating an error in operation of the MEMS accelerometer sensor if the sensed acceleration value and desired acceleration value are not substantially equal.

38. The method of claim 32, further comprising applying an AC drive signal to the MEMS accelerometer sensor.

39. The method of claim 38, wherein the AC drive signal has a low voltage level during assertion of each pulse.

40. The method of claim 32, wherein the physical displacement of the mobile mass in response to said test signal corresponds to the desired acceleration value which is a positive acceleration.

41. The method of claim 32, wherein the physical displacement of the mobile mass in response to said test signal corresponds to the desired acceleration value which is a negative acceleration.

42. The method of claim 32, wherein the physical displacement of the mobile mass in response to said test signal is performed in a first deflection check which corresponds to the desired acceleration value which is a positive acceleration and further performed in a second deflection check which corresponds to the desired acceleration value which is a negative acceleration.

43. The method of claim 42, wherein the first and second deflection checks are performed in either order.

44. A method for self-testing a microelectromechanical system (MEMS) accelerometer sensor having a mobile mass and at least one sensing capacitor and a rotor node, comprising:
cyclically repeating a sensing circuit reset phase and a sensing circuit read phase over a self-testing time period;
generating a test signal that includes a series of pulses over said self-testing time period;
applying an AC drive signal to the rotor node, wherein the AC drive signal has a low voltage level during assertion of each pulse for the test signal;
during each sensing circuit reset phase, applying a pulse of said test signal to the at least one sensing capacitor in order to generate an electrostatic force which produces a physical displacement of the mobile mass corresponding to a desired acceleration value; and
during each read phase of the sensing circuit, sensing a variation in capacitance of the at least one sensing capacitor due to the physical displacement of the mobile mass and converting the sensed variation in capacitance to a sensed acceleration value.

45. The method of claim 44, further comprising:
comparing the sensed acceleration value to the desired acceleration value; and
indicating an error in operation of the MEMS accelerometer sensor if the sensed acceleration value and desired acceleration value are not substantially equal.

46. The method of claim 44, wherein said pulses within the series of pulses have a same duty cycle.

47. The method of claim 44, wherein at least two pulses within the series of pulses have different duty cycles.

48. The method of claim 44, further comprising skipping at least one pulse within the series of pulses.

49. The method of claim 44, further comprising, at an end of the self-testing time period:

comparing the sensed acceleration value to the desired acceleration value; and indicating an error in operation of the MEMS accelerometer sensor if the sensed acceleration value and desired acceleration value are not substantially equal.

50. The method of claim 44, wherein the physical displacement of the mobile mass in response to said test signal corresponds to the desired acceleration value which is a positive acceleration.

51. The method of claim 44, wherein the physical displacement of the mobile mass in response to said test signal corresponds to the desired acceleration value which is a negative acceleration.

* * * * *